(12) United States Patent
Hamada

(10) Patent No.: US 8,638,615 B2
(45) Date of Patent: Jan. 28, 2014

(54) SEMICONDUCTOR STORAGE DEVICE, HOST CONTROLLING THE SAME, AND MEMORY SYSTEM INCLUDING THE SEMICONDUCTOR STORAGE DEVICE AND THE HOST

(75) Inventor: Makoto Hamada, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 13/325,479

(22) Filed: Dec. 14, 2011

(65) Prior Publication Data
US 2013/0155779 A1  Jun. 20, 2013

(51) Int. Cl.
*G11C 7/10* (2006.01)
*G11C 11/00* (2006.01)

(52) U.S. Cl.
USPC ...................... 365/189.05; 365/148

(58) Field of Classification Search
USPC ............................ 365/148, 189.05
See application file for complete search history.

(56) References Cited

U.S. PATENT DOCUMENTS

| 5,822,245 | A | 10/1998 | Gupta et al. |
| 5,867,430 | A | 2/1999 | Chen et al. |
| 2008/0279009 | A1* | 11/2008 | Park ........................ 365/185.18 |
| 2012/0002457 | A1* | 1/2012 | Kanda .......................... 365/148 |
| 2012/0155178 | A1* | 6/2012 | Ohta et al. ............... 365/185.17 |

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a semiconductor storage device includes a memory cell array, a data latch group. The memory cell array comprises a plurality of memory cells. The data latch group holds a first address or a second address of the memory cell and data. The data latch group comprises a first data latch unit and a second data latch unit, the first data latch unit holds write data to be written to any of the memory cells or read data read from the memory cell array and the first address or the second address, while the second data latch unit holds second write data or read data.

18 Claims, 16 Drawing Sheets

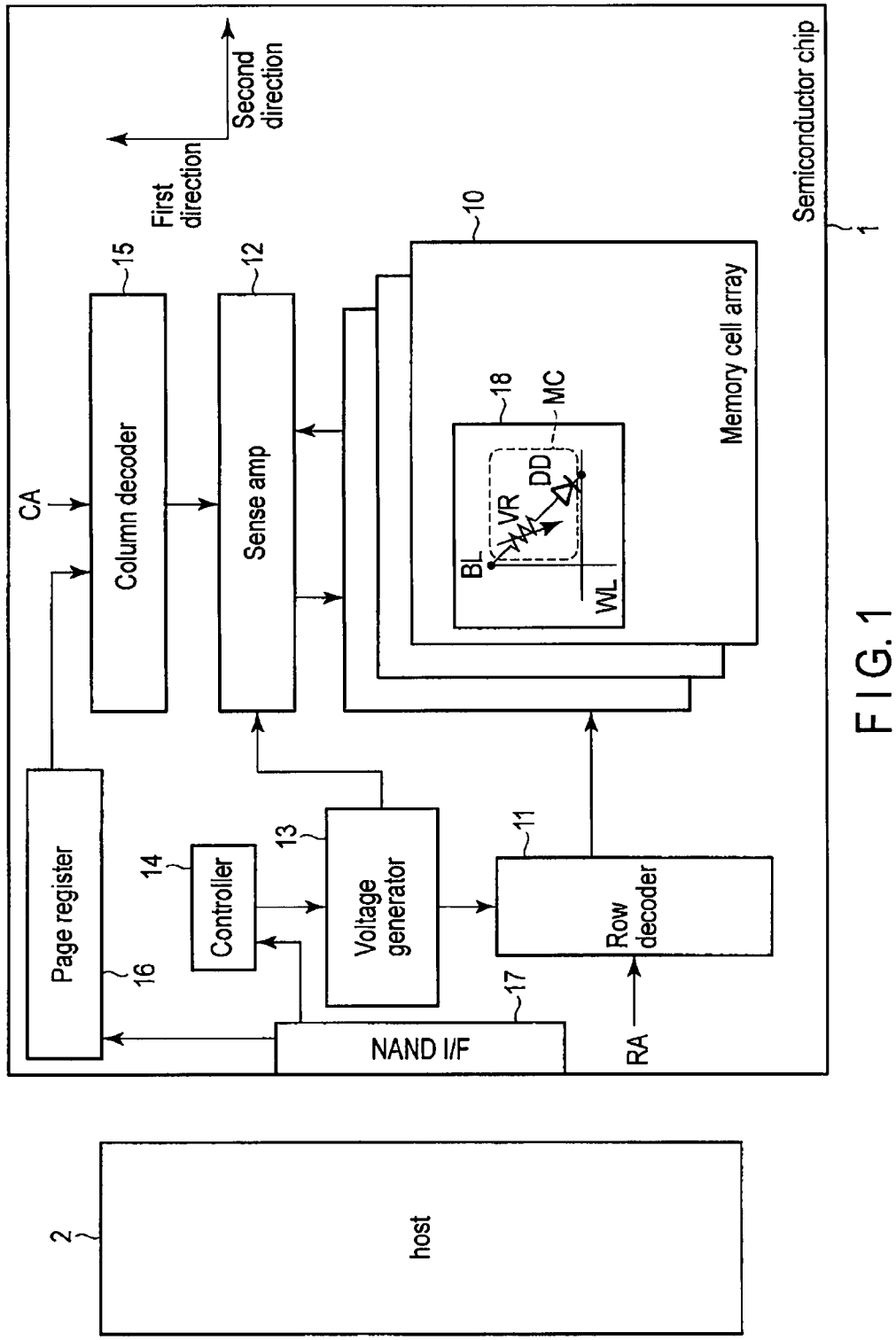
F I G. 1

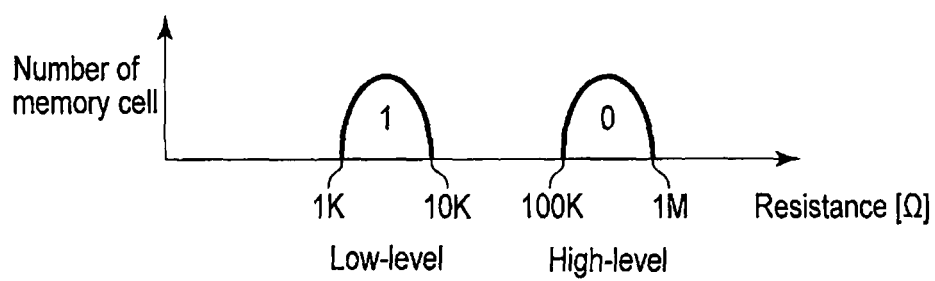
F I G. 4

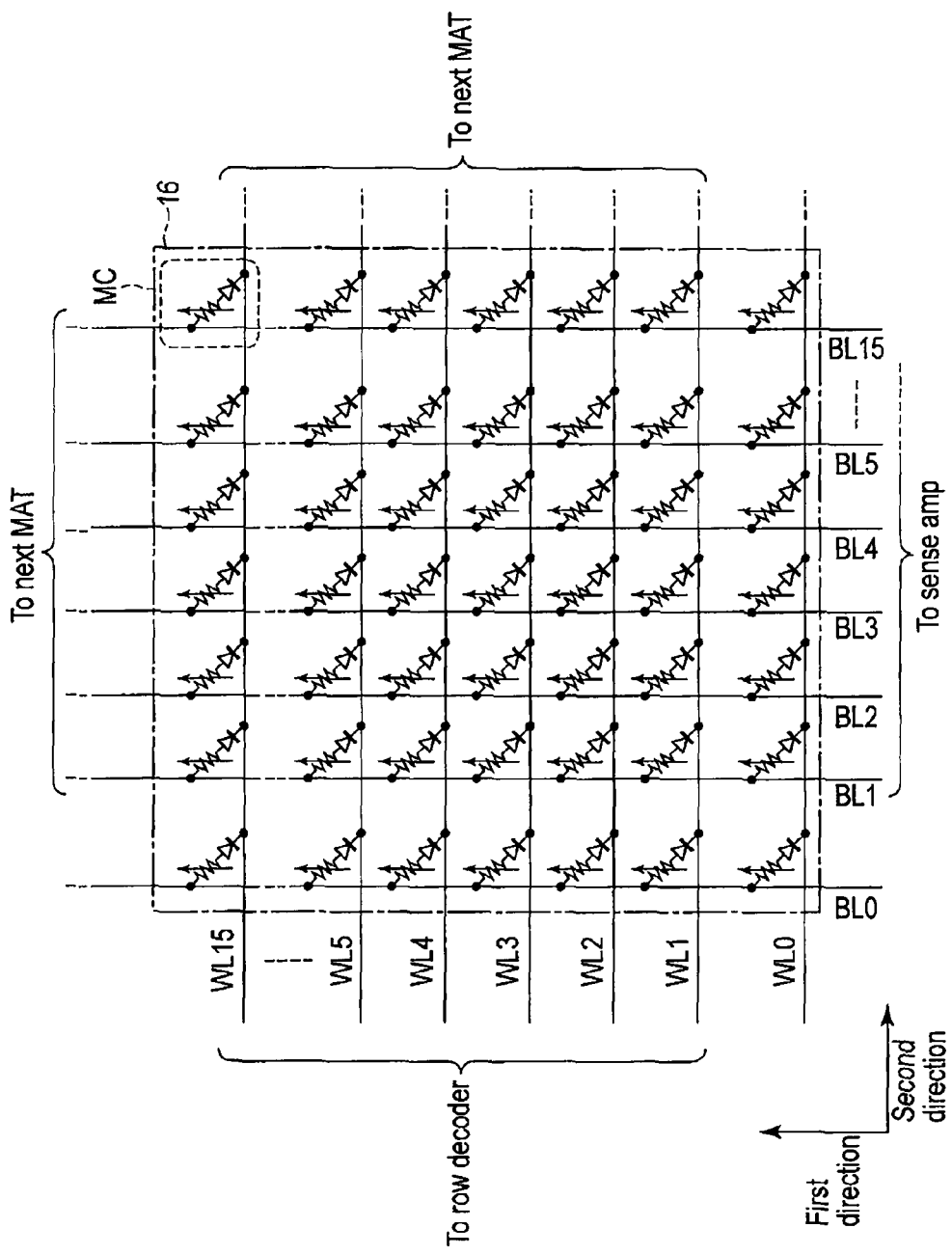
F I G. 5

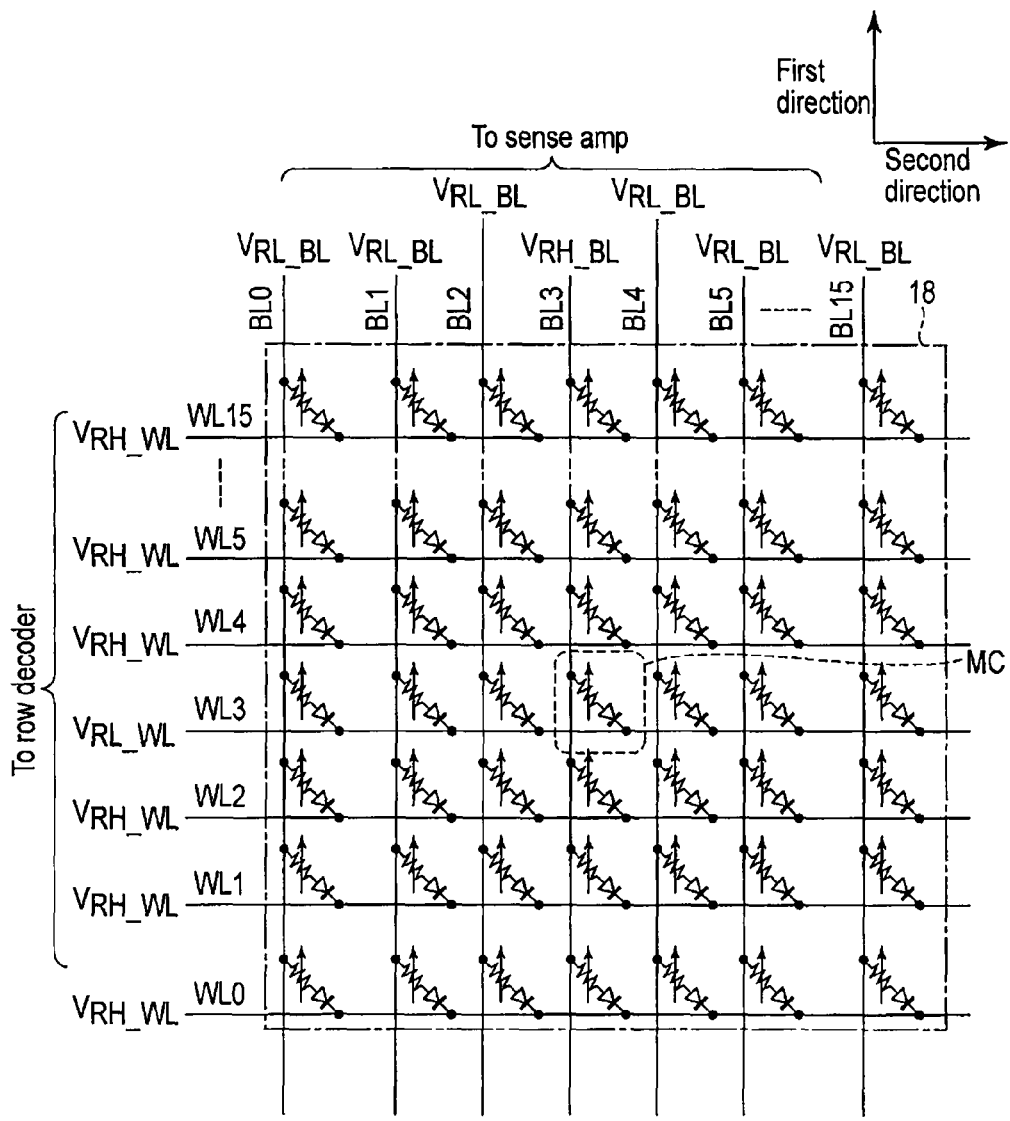
F I G. 6

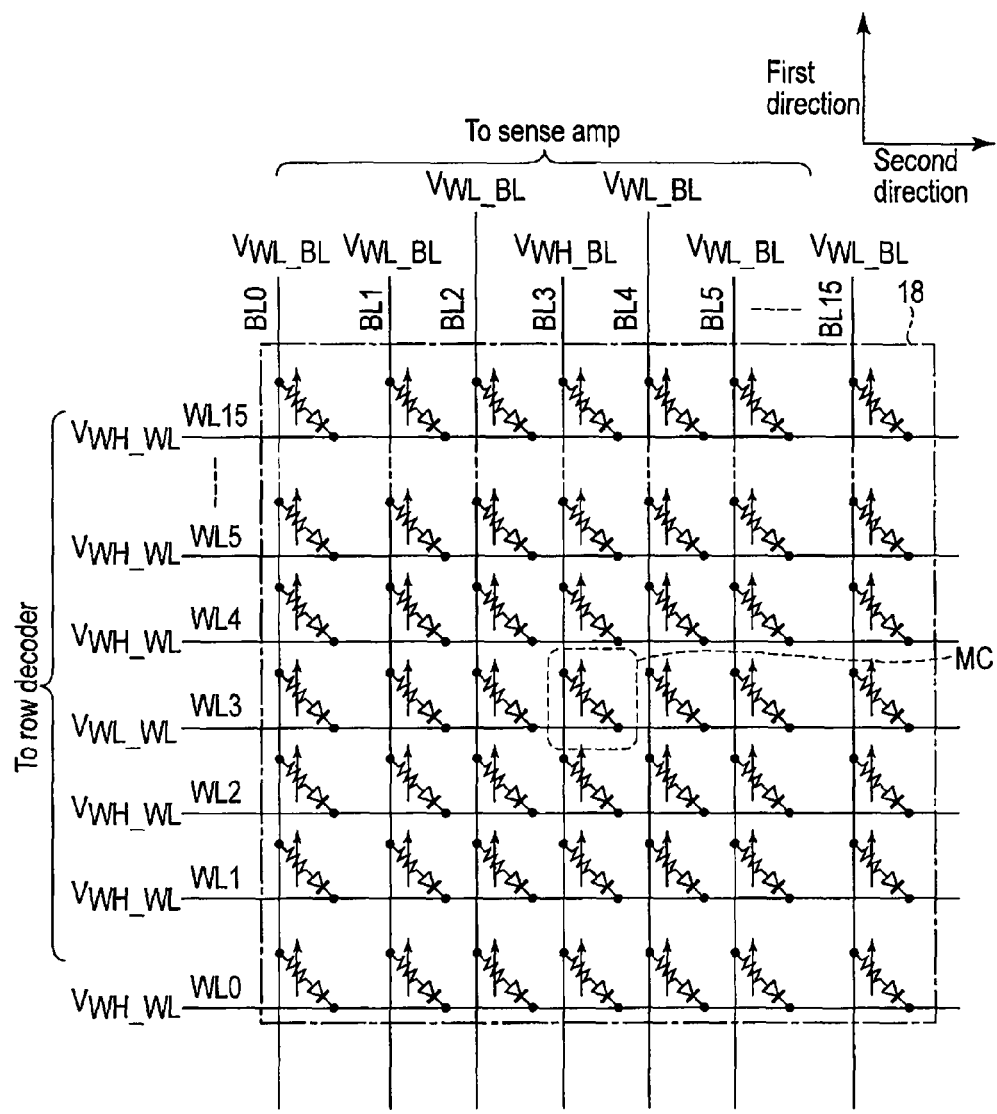
F I G. 7

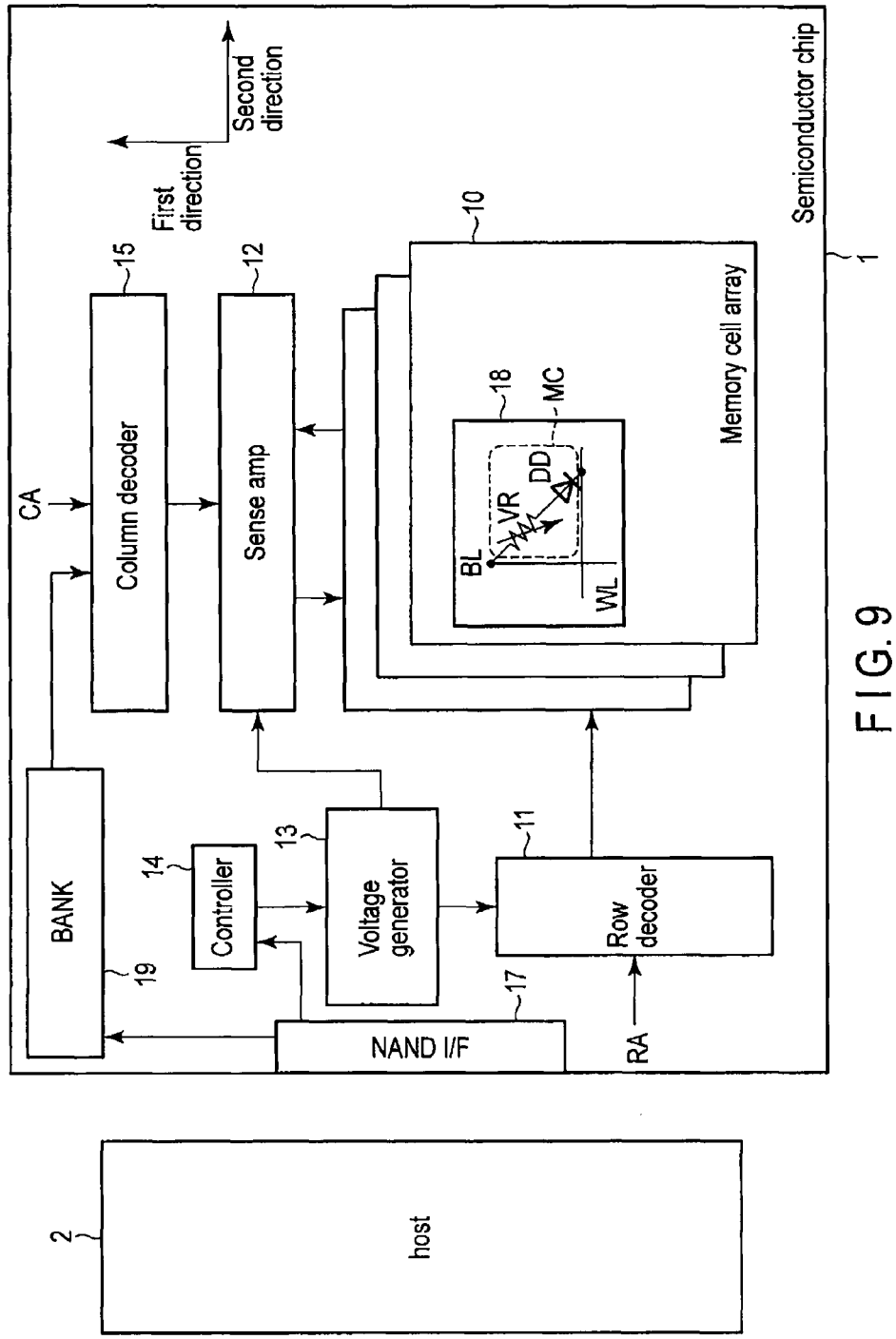
F I G. 9

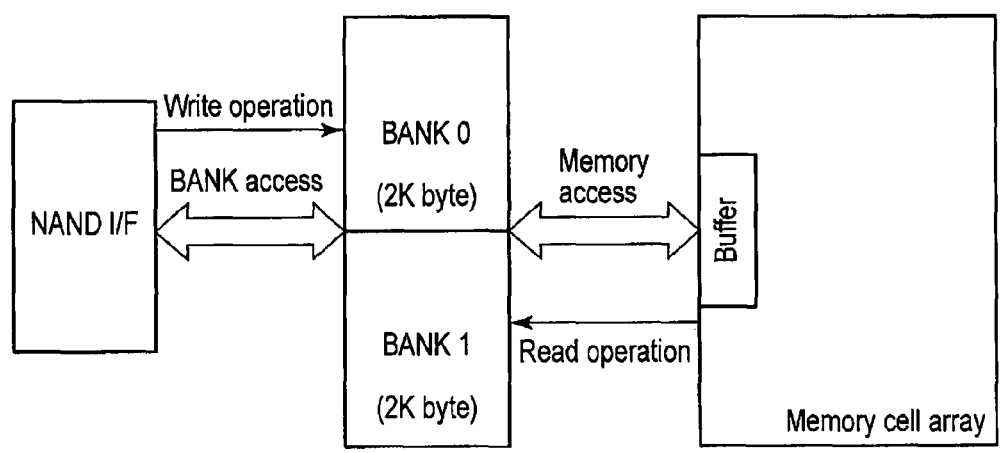
F I G. 10

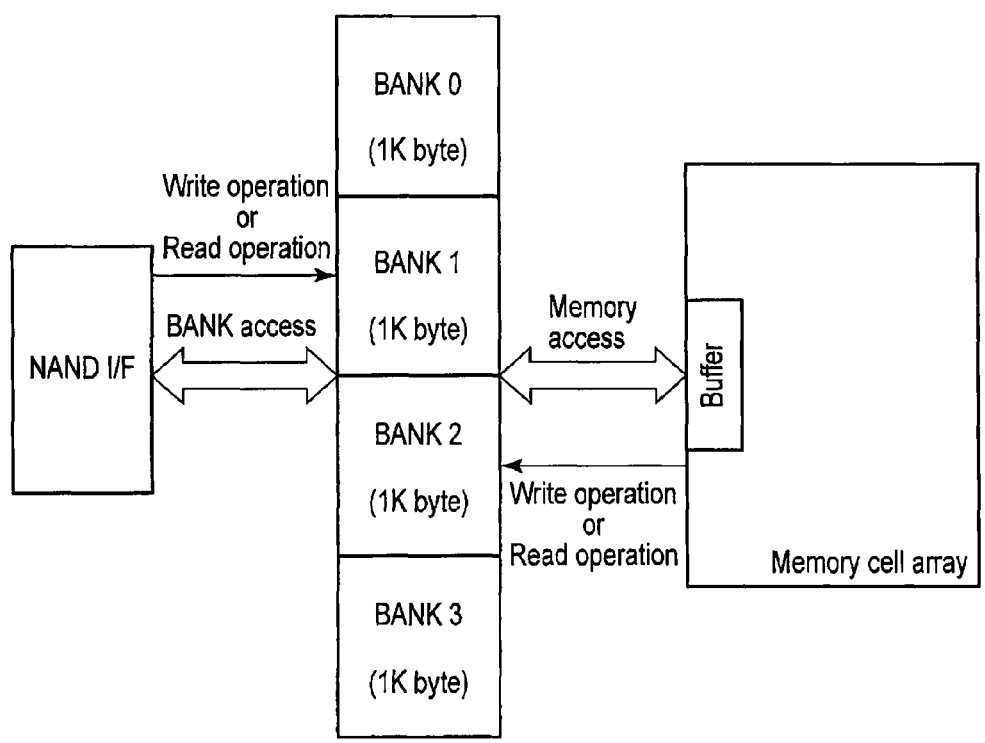
F I G. 15

SEMICONDUCTOR STORAGE DEVICE, HOST CONTROLLING THE SAME, AND MEMORY SYSTEM INCLUDING THE SEMICONDUCTOR STORAGE DEVICE AND THE HOST

FIELD

Embodiments described herein relate generally to, for example, a semiconductor storage device including a data latch capable of holding the address of a memory cell serving as a write target or a read target, a host controlling the semiconductor device, and a memory system including the semiconductor storage device and the host.

BACKGROUND

In recent years, memory cells (Resistance Random Access Memory: ReRAM) each including a rectifying device (diode) and a variable resistance element have been developed.

BRIEF DESCRIPTION OF THE DRAWINGS

FIG. 1 is a general view of a memory system according to a first embodiment;

FIG. 4 is a diagram showing the threshold distribution of memory cells according to the first embodiment;

FIG. 5 is a circuit diagram of the memory cell array according to the first embodiment;

FIG. 6 is a conceptual diagram of data read according to the first embodiment;

FIG. 7 is a conceptual diagram of data write according to the first embodiment;

FIG. 9 is a general view of a memory system according to a second embodiment;

FIG. 10 is a conceptual diagram of data transfer according to the second embodiment;

FIG. 15 is a conceptual diagram of data transfer according to a third embodiment.

DETAILED DESCRIPTION

Figure 2:
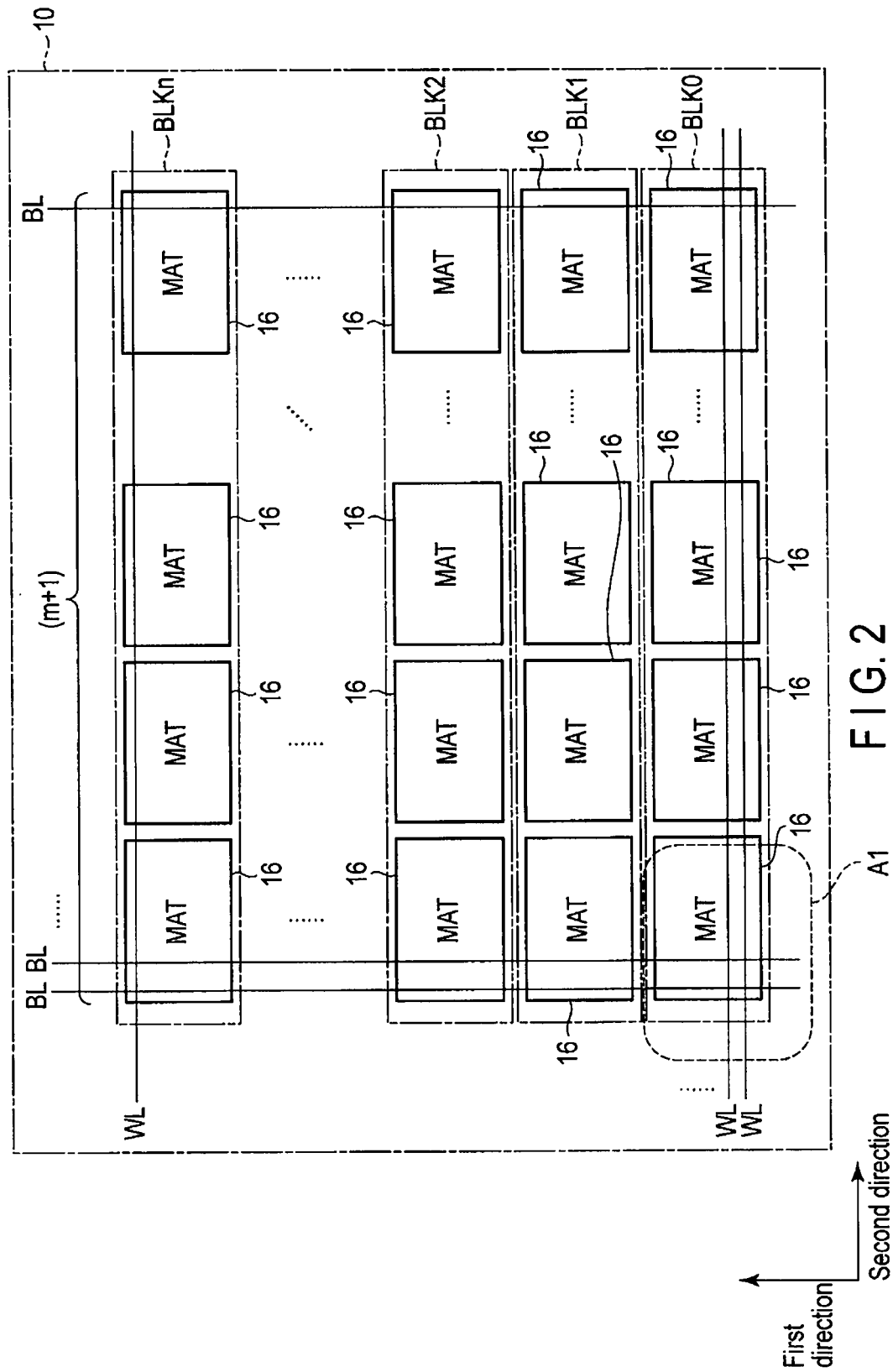
FIG. 2 is a conceptual diagram of a memory cell array according to the first embodiment.

Embodiments will be described below with reference to the drawings.

In general, according to one embodiment, a semiconductor storage device includes a memory cell array, and a data latch group. The memory cell array includes a plurality of memory cells capable of holding data. The data latch group is capable of holding a first address of the memory cell serving as a read target or a second address of the memory cell serving as a write target, and the data held by the memory cells. The data latch group includes a plurality of data latch units including at least a first data latch unit and a second data latch unit. The first data latch unit holds one of write data to be written to the memory cell and read data read from the memory cell array, and one of the first address and the second address corresponding to the write data and the read data, respectively, while the second data latch unit holds one of the write data to be written to the memory cell and the read data read from the memory cell array.

[One Embodiment]

A memory system in which a storage device according to the present embodiment is mounted uses a plurality of data latches provided therein to efficiently read and write data. Furthermore, the memory system includes a data latch (hereinafter referred to as BANK) capable of holding address information, thus allowing data to be efficiently transferred. Moreover, the memory system allows the number of BANKs to be variably set according to the rate of data transfer between the set of BANKs and an interface configured to transfer data to and from the exterior, and the rate of data transfer between the set of BANKs and a memory cell array. In the embodiments below, by way of example, a resistance random access memory (ReRAM) is used as memory cells MC. An example of a general configuration of the memory system according to the present embodiment will be described with reference to FIG. 1.

1. Example of a General Configuration

FIG. 1 is a block diagram of the memory system in which ReRAM is mounted as the memory cells MC of a semiconductor storage device. As shown in FIG. 1, the memory system according to the present embodiment includes a semiconductor chip 1 and a host 2 configured to control the semiconductor chip 1. The semiconductor chip 1 will be described. The semiconductor chip 1 includes a memory cell array 10, a row decoder 11, a sense amplifier 12, a voltage generator 13, a controller 14, a column decoder 15, a page register 16, and NAND I/F 17.

1.1-1. Memory Cell Array 10

The memory cell array 10 includes a plurality of bit lines BL provided along a first direction, a plurality of word lines WL provided along a second direction orthogonal to the first direction, and a plurality of memory cells MC provided at the respective intersection points between the bit lines BL and the word lines WL. An aggregate of the plurality of memory cells MC forms a unit called a mat 18.

Each of the memory cells MC includes a rectifying diode DD and a variable resistance element VR. A cathode of the diode DD is connected to the corresponding word line WL. An anode of the diode DD is connected to the corresponding bit line BL via the variable resistance element VR. The variable resistance element VR has a structure in which the diode DD, a recording layer, and a protect layer are sequentially stacked in this order.

In the memory cell array 10, a plurality of the memory cells MC arranged on the same row are connected to the same word line WL. A plurality of the memory cells MC arranged on the same column are connected to the same bit line BL. Furthermore, a plurality of the word lines WL, a plurality of the bit lines BL, and a plurality of the memory cells MC are provided along a third direction (the direction of a normal to a surface of a semiconductor substrate) orthogonal to the first and second direction. That is, the memory cell array 10 has a structure in which the memory cells MC are three-dimensionally stacked. Each layer of memory cells in this three-dimensional structure is hereinafter referred to as a memory cell layer.

1.1-2. Details of the Memory Cell Array 10

Now, an example of detailed configuration of the above-described memory cell array 10 will be described with reference to FIG. 2. FIG. 2 is a block diagram of the memory cell array 10 showing only one memory cell layer.

As shown in FIG. 2, the memory cell array 10 includes (m+1)×(n+1) mats 18 arranged in a matrix, where m and n are each a natural number equal to or greater than 1. As described above, each of mats 18 includes a plurality of memory cells MC arranged in a matrix. For example, one mat 18 includes 16 word lines WL and 16 bit lines BL. That is, (16×16) memory cells MC are included in one mat 18. Furthermore, 16×(m+1) bit lines BL and 16×(n+1) word lines WL are included in the memory cell array 10. A plurality of the mats 18 on the same row (that is, the mats 18 sharing the same word line WL) form a block BLK. Thus, the memory cell array 10 comprises blocks BLK0 to BLKn. If the blocks BLK0 to BLKn are hereinafter not distinguished from one another, the blocks BLK0 to BLKn are simply collectively referred to as a block BLK.

Furthermore, in the description of the present embodiment, one memory cell layer includes a plurality of mats 18. However, the number of mats 18 may be one. Furthermore, the number of memory cells MC included in one mat 18 is not limited to (16×16). Moreover, the row decoder 11 and the sense amplifier 12 may be provided for each of the mats 18 or shared by a plurality of the mats 18. The latter case will be described below.

1.1-3. Perspective View of the Memory Cell Array 10

Figure 3:
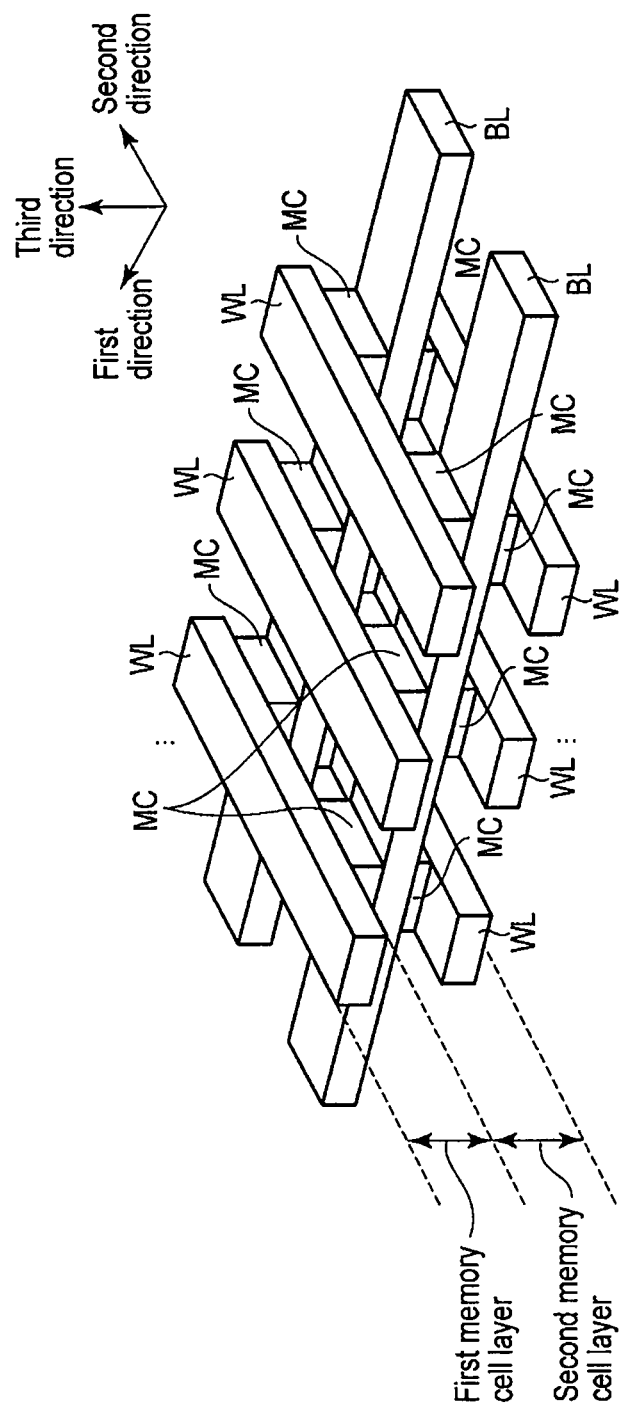
FIG. 3 is a perspective view three-dimensionally illustrating the memory cell array according to the first embodiment.

FIG. 3 is a perspective view of a partial area of the memory cell array 10 showing that the memory cell array 10 with the above-described configuration is three-dimensionally configured. As shown in FIG. 3, a plurality of the memory cell arrays 10 according to the present example are stacked (as a first memory cell layer, a second memory cell layer, . . . ) in the direction perpendicular to the substrate surface of the semiconductor substrate (third direction). In the example illustrated in FIG. 3, the word line WL, the memory cell MC, the bit line BL, the memory cell MC, the word line WL, . . . are formed in this order. However, sets each of the word line WL, the memory cell MC, and the bit line BL may be stacked via interlayer insulating films.

1.1-4. Electrical Characteristics of the Memory Cell MC

Now, the electrical characteristics of the memory cell MC will be described with reference to FIG. 4. As described above, the memory cell MC may be set to one of a low resistance state and a high resistance state depending on the resistance value of the variable resistance element VR. The memory cell MC holds "1" in the low resistance state and "0" data in the high resistance state. Furthermore, the low resistance state corresponds to a resistance value of, for example, 1 kΩ to 10 kΩ. The high resistance state corresponds to a resistance value of, for example, 100 kΩ to 1 MΩ. When a forward bias is applied to the memory cells MC each in one of the above-described states, the memory cells MC in the low resistance state, which hold "1" data, have a greater current amount than the memory cells MC in the high resistance state, which hold "0" data.

1.1-5. Circuit Diagram of the Memory Cell MC

FIG. 5 is a circuit diagram of the memory cell array 10 particularly showing an area in one memory cell layer which corresponds to an area A1 in FIG. 2.

As shown in FIG. 5, in the memory cell array 10, a plurality of the bit lines BL and a plurality of the word lines WL are formed so as to pass thorough a plurality of the mats 18.

The mat 18 includes 16 bit lines BL and 16 word lines WL. Furthermore, as described above, (m+1)×(n+1) mats 18 are provided. That is, word lines WL(16i) to WL(16i+15) are formed in one block BLKi. Additionally, bit lines BL(16j) to BL(16j+15) are formed in each of the plurality of mats 18 included in one block BLK. In this case, i=0 to n and j=0 to m.

The memory cell MC is formed at each of the intersection points between the bit lines BL and the word lines WL.

The word lines WL are connected to the row decoder 11. On the other hand, the bit lines BL0 to BLn are connected to the sense amplifier 12.

2. Peripheral Circuits

With reference back to FIG. 1, the row decoder 11, the sense amplifier 12, the voltage generator 13, the controller 14, the column decoder 15, the page buffer 16, and NAND I/F 17 will be described.

2.1-1. Row Decoder 11

For data write, data read, and data erase, the row decoder 11 decodes a row address RA supplied by a host apparatus. That is, the row decoder 11 selects any of the word lines WL according to the result of decoding of the row address RA, and transfers appropriate voltages supplied by the voltage generator 13 described below to the selected word line WL and unselected word lines WL.

More specifically, for data read, the row decoder 11 applies a voltage $V_{RL\_WL}$ to the selected word line WL and a voltage $V_{RH\_WL}$ (>the voltage $V_{RL\_WL}$) to the unselected word lines WL. For data write, the row decoder 11 applies a voltage $V_{L\_WL}$ to the selected word line WL and a voltage $V_{WH\_WL}$, (>the voltage $V_{WL\_WL}$) to the unselected word lines WL. If a reverse bias is applied to the rectifying element DD for read, the row decoder 11 may apply the voltage $V_{RL\_WL}$ to the unselected word lines WL. That is, if a reverse bias is applied, the magnitude relationship between the voltage $V_{RH\_WL}$ and the voltage $V_{RL\_WL}$ may be the voltage $V_{RH\_WL}$<the voltage $V_{RL\_WL}$ or the voltage $V_{RH\_WL}$=the voltage $V_{RL\_WL}$. In the description below, a voltage $V_{H\_WL}$>a voltage $V_{L\_WL}$.

2.1-2 Column Decoder 15

For data write, data read, and data erase, the column decoder 15 decodes a column address CA supplied by a host apparatus (not shown in the drawings). That is, the column decoder 15 selects any of the bit lines BL according to the result of decoding of the column address CA.

2.1-3 Sense Amplifier 12

The sense amplifier 12 is electrically connected to the bit lines BL. For data write, data read, and data erase, the sense amplifier 12 transfers appropriate voltages supplied by the voltage generator 13 to the selected bit line BL selected by the column decoder 15 and to the unselected bit lines BL. More specifically, for data read, the sense amplifier 12 applies a voltage $V_{RH\_BL}$ to the selected bit line BL and a voltage $V_{RL\_BL}$ (<the voltage $V_{RH\_BL}$) to the unselected bit lines BL. For data write, the sense amplifier 12 applies a voltage $V_{WH\_BL}$ to the selected bit line BL and a voltage $V_{WL\_BL}$ to the unselected bit lines BL. If a reverse bias is applied to the rectifying element DD for read, the sense amplifier 12 may apply the voltage $V_{RH\_BL}$ to the unselected bit lines BL.

The sense amplifier 12 also includes a buffer 20 as shown in FIG. 1. That is, the sense amplifier 12 transfers the above-described voltages to the bit lines BL for data read, senses and amplifies data resulting from the read, and then holds the data in the buffer 20. Moreover, for data write, the sense amplifier 12 transfers the above-described voltages to the bit lines BL according to the data held in the buffer 20.

The sense amplifier 12, the row decoder 11, and the column decoder 15 may be provided for each memory cell layer and for each mat 12 or shared among the memory cell layers. Moreover, if the sense amplifier 12, the row decoder 11, and the column decoder 15 are shared among the memory cell layers, the allocation of the addresses of the memory cells MC may be changed or modified. This allows an increase in the scale of the peripheral circuits such as the sense amplifier 12, the row decoder 11, and the column decoder 15 to be inhibited even if a plurality of memory cell layers are stacked.

2.1-4 Voltage Generator 13

The voltage generator 13 generates the above-described voltages $V_{RL\_BL}$, $V_{RH\_BL}$, $V_{RL\_WL}$, and $V_{RH\_WL}$ for read and the above-described voltages $V_{WL\_BL}$, $V_{WH\_BL}$, $V_{WL\_WL}$, and $V_{WH\_WL}$ for write. The voltage generator 13 supplies the voltages $V_{RL\_WL}$, $V_{RH\_WL}$, $V_{WL\_WL}$, and $V_{RH\_WL}$ to the row decoder 11 and the voltages $V_{RL\_BL}$, $V_{RH\_BL}$, $V_{WL\_BL}$, and $V_{WH\_BL}$ to the column decoder 15.

2.1-5. Controller 14

The controller 14 controls the operation of the semiconductor chip 1 as a whole in accordance with control signals and the like from the host 2. Specifically, the controller 14 executes operating sequences for a data write operation, a data read operation, and a data erase operation based on control signals, commands, and addresses received from NAND I/F 17. To execute the operating sequences, the controller 14 controls the operation of circuit blocks contained in the semiconductor chip 1.

The controller 14 also outputs a busy signal to the host 2. The busy signal notifies an external apparatus of the operating state of the semiconductor chip 1. That is, the busy signal is asserted (in the present embodiment, this corresponds to an 'L' level) while data is being written to or read from the semiconductor chip 1, thus precluding external accesses from being accepted. This state is hereinafter referred to as a busy state. On the other hand, external accesses are enabled, the busy signal is negated (in the present embodiment, this corresponds to an 'H' level). This state is hereinafter referred to as a ready state.

2.1-6. Page Register 16

The page register 16 can hold write data supplied by the host 2 via NAND I/F 17 described below. The page register 16 also temporarily holds data read from the memory cell array 10, and outputs the data to the host 2 via NAND I/F 17. An area of use of the page register 16 is set by the controller 14. For example, if the page register 16 as a whole has an area in which 4 Kbytes of data can be held, the area of use of the page register 16 may vary as follows: all of the 4 Kbytes may be used, or the page register 16 may be divided into two areas (two 2-Kbyte areas) so that one of the two areas is used, or the page register 16 may be divided into four areas (four 1-Kbyte areas) so that one of the four areas is used.

2.1-7. NAND I/F 17

NAND I/F 17 receives write data, control signals, commands, and addresses from the host 2. NAND I/F 17 supplies the write data to the page register 16 and then supplies the control signals, commands, and addresses to the controller 14. Furthermore, NAND I/F 17 outputs read data and control signals (the busy signal and the like) from the controller 14, to the host 2.

3.1-1. Host 2

The host 2 controls the operation of the semiconductor chip 1. Specifically, the host 2 supplies control signals, commands, addresses, write data, and the like to the semiconductor chip 1. The host 2 thus controls write operations, read operations, erase operations, and the like performed on the semiconductor chip 1. Furthermore, upon receiving the (asserted) busy signal from the semiconductor chip 1, the host 2 avoids controlling the semiconductor chip 1. That is, the semiconductor chip 1 avoids outputting control signals, commands, addresses, write data, and the like.

Furthermore, the host 2 sets the area of use of the page register 16 in the semiconductor chip 1 according to the amount of data handled. Specifically, if a small amount of data is read or written, the area of use of the page register 16 is reduced. If a large amount of data is read or written, the area of use of the page register 16 is increased. This allows data transfer rate to be increased, for example, when the area of use is small.

4. Read Operation

Now, a data read operation will be described with reference to FIG. 6. Here, the read operation will be described on the assumption that 16 bit lines BL and 16 word lines WL are formed in the memory cell array 10 by way of example. Furthermore, the memory cell MC serving as a read target is the memory cell MC33 provided at the intersection point between the bit line BL3 and the word line WL3.

As described above, for read, a forward bias needs to be applied to the memory cell MC33, serving as a read target. Thus, the row decoder 11 and the column decoder 15 transfers the voltage $V_{RH\_BL}$ to the selected bit line BL3 to which the memory cell MC33 is connected, while transferring the voltage $VL_{RL\_WL}$ to the selected word line WL3. The voltage $_{RL\_BL}$ is transferred to the other bit lines BL, that is, the unselected bit lines BL1, BL2, and BL4 to BL15. The voltage $_{RH\_WL}$ is transferred to the other word lines WL, that is, the unselected bit lines WL1, WL2, and WL4 to WL15. Then, the sense amplifier 12 senses the value of a current flowing through the selected bit line BL3 to enable the data "1" or "0" held by the memory cell MC33 to be read. That is, the sense amplifier 12 reads the "0" data held by the memory cell MC if the value of the current flowing through the selected bit line BL3 is small, and reads the "1" data held by the memory cell MC if the current value is large.

5. Write Operation

Now, a data write operation will be described with reference to FIG. 7. Also for the write operation, the write operation will also be described on the assumption that 16 bit lines BL and 16 word lines WL are formed in the memory cell array 10. Furthermore, the memory cell MC serving as a write target is the memory cell MC33 provided at the intersection point between the bit line BL3 and the word line WL3.

As described above, for write, a forward bias needs to be applied to the memory cell MC33, serving as a write target. Thus, the row decoder 11 and the column decoder 15 transfers the voltage $V_{WH\_BL}$ to the selected bit line BL3 to which the memory cell MC33 is connected, while transferring the voltage $VL_{WL\_WL}$, to the selected word line WL3. The voltage $_{WL\_BL}$ is transferred to the other bit lines BL, that is, the unselected bit lines BL1, BL2, and BL4 to BL15. The voltage $_{WH\_WL}$ is transferred to the other word lines WL, that is, the unselected bit lines WL1, WL2, and WL4 to WL15. This enables one of the "0" data and the "1" data to be written to the memory cell MC33. One of "0" data and the "1" data can also be written depending on the pulse width of the applied voltage or the rate of rise of the voltage rather than on the difference in the voltage applied to the memory cell MC between the bit line BL and the word line WL.

6. Conceptual Diagram of Data Transfer

Figure 8:
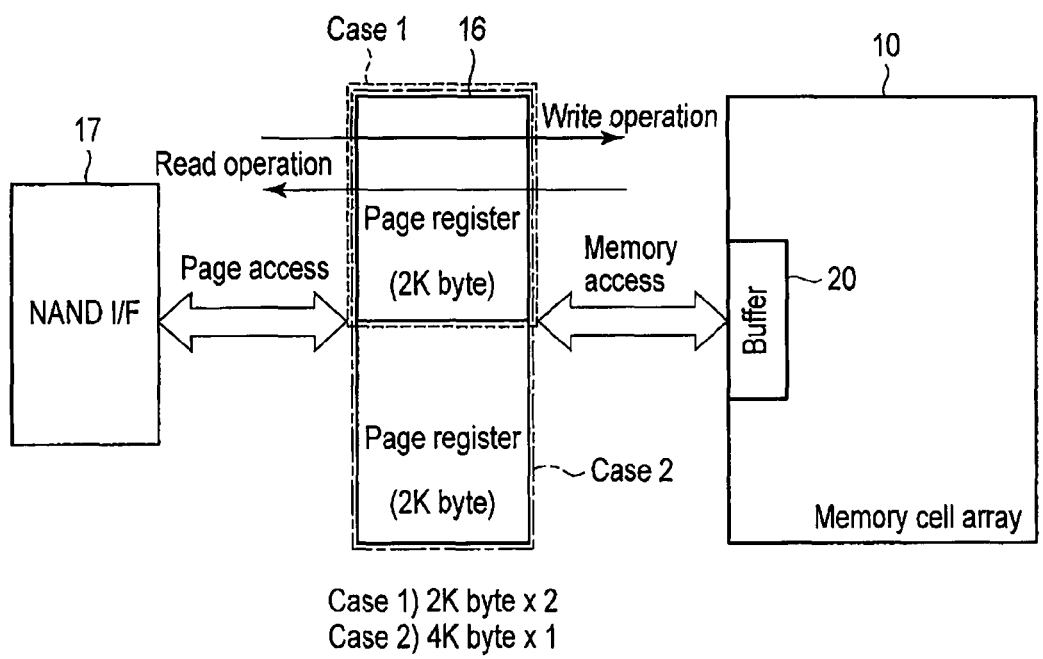
FIG. 8 is a conceptual diagram of data transfer according to the first embodiment.

Now, a conceptual diagram of data transfer will be described with reference to FIG. 8. FIG. 8 is a conceptual diagram of data inputs/outputs carried out via the page register 16. As described above, the host 2 can specify an available area for the page register 16 according to the size of data to be read or written. In the present embodiment, by way of example, the available area of the page register 16 as a whole corresponds to 4 Kbytes, and the host 2 allows, for example, a 2-Kbyte area of the page register 16 to be used if the amount of input and output data is small, and allows the 4-Kbyte area to be used if the amount of input and output data is large.

The available area corresponds to 4 Kbytes.

The page register 16 temporarily holds data received from and output to an external apparatus. That is, the page register 16 outputs write data transferred from NAND I/F 17 and temporarily held therein to the buffer 20. The page register 16 temporarily holds data read from the buffer 20 and then outputs the data to the host 2 via NAND I/F 17. In this case, the page register 16 are involved in memory accesses to and from the buffer 20 and page accesses to and from NAND I/F 17. In the present embodiment, read speed is high because ReRAM is used as the memory cells MC. Thus, data is transferred faster in the memory access than in the page access.

Furthermore, the page register 16 receives every 512 bits of read data from the buffer 20, and once 4 Kbytes of data is accumulated, outputs the data to NAND I/F 17. That is, in the present embodiment, the memory cell array 10 outputs 512 bits of read data during one read operation. Hence, after performing eight read operations, the page register 16 outputs accumulated 4 Kbytes of data to the NAND I/F 17.

In contrast, for data write, once the amount of write data supplied by NAND I/F 17 and accumulated in the page register 16 reaches 4 Kbytes, the page register 16 outputs the data to the buffer 20.

Every 512 bits of data are read from the memory cell array because the number of memory cells MC that can be accessed at a time is limited in connection with a current flowing through Re-RAM. This reduces the number of cells that can be accessed at a time with respect to page size. Here, the page size is, for example, $2 \times 2^{10} + 128 = 2,176 \times 8$ bits ($=17,408$ bits).

The available area corresponds to 2 Kbytes.

One of the 2-Kbyte areas into which the page register 16 is divided carries out data transfer similar to that described above, on the NAND I/F 17 and the buffer 20. Here, the 2-Kbyte area of the page register 16 which outputs and receives data to and from NAND I/F 17 and the buffer 20 is referred to as a page register $16_{main}$, and the other 2-Kbyte area which does not perform the above-described data I/O operation is referred to as a page register $16_{sub}$. Furthermore, the since the available area corresponds to 2 Kbytes, the page register 16, after performing four read operations, outputs the held 2 Kbytes of read data to NAND I/F 17 though a page access.

In contrast, for data write, once the amount of write data supplied by NAND I/F 17 and accumulated in the page register $16_{main}$ reaches 4 Kbytes, the page register $16_{main}$ outputs the data to the buffer 20.

In the semiconductor storage device according to the present embodiment, the available area of the page register can be varied depending on the capacity of read or written data. That is, the available area of the page register can be varied as needed depending on the data handled so that, for example, if small data is to be read or written, a quick read or write can be achieved. Since Re-RAM is used as the memory cells MC, although only a small amount of data, that is, 512 bytes of data, are read during one read operation, high-speed data transfers can be achieved because the read speed is higher than in a NAND flash memory.

[Second Embodiment]

Now, a memory system according to a second embodiment will be described. In the second embodiment, instead of the page register, BANK is provided which holds both data and address information about the memory cell MC serving as a read or write target. Data is input and output via BANK.

1.1-1. Example of a General Configuration

FIG. 9 shows an example of a general configuration of the memory system according to the second embodiment. Components of the second embodiment similar to those of the above-described first embodiment will not be described below.

As shown in FIG. 9, the present embodiment is configured such that instead of the page register 16, BANK 19 is provided on the semiconductor chip 1. BANK 19 will be described below in detail.

1.1-2. Details of BANK 19

BANK 19 can be divided into a plurality of BANK units. Each of the BANK units is a data holding section formed of a plurality of data latches. As described above, BANK 19 can hold read data or write data and associated address information. Specifically, BANK 19 can hold address information about the memory cell MC serving as a write target together with write data, and can hold address information about the memory cell MC serving as a read target together with read data. The amount of data in the address information associated with the amount of the write or read data is, for example, about 2 bytes if BANK 19 holds 2 Kbytes of read or write data.

Furthermore, BANK 19 simultaneously carries out a data I/O operation on the buffer 20 and NAND I/F 17. The details of the data transfer will be described below. For example, BANK 19 receives write data from NAND I/F 17 while receiving data read from the buffer 20. In this regard, the data transfer is different from that of the page register 16 described in the first embodiment.

1.1-3. Details of the Controller 14

The controller 14 according to the present embodiment is different from that according to the above-described first embodiment in that the controller 14 according to the present embodiment determines the status of each of the BANK units and outputs the results to the host 2. Specifically, upon receiving a "status command" from the host 2, the controller 14 determines the status of each band unit. That is, the controller 14 determines whether or not read or write data is held in the BANK unit, whether or not, with a write or read operation being performed, data is about to be loaded into the BANK unit, and the like. The controller 14 outputs the results of the determination to the host 2 via NAND I/F 17.

1.1-4. Details of the Host 2

Owing to the presence of BANK 19, the host according to the second embodiment has functions different from those according to the first embodiment. The host 2 divides one BANK 19 into a plurality of BANK units, for example, one 4-Kbyte BANK 19 into two 2-Kbyte BANK units. That is, the host 2 has an instruction command for setting the configuration of BANK 19.

Furthermore, the host 2 issues a write instruction, a read instruction, a write data, the address of the memory cell MC serving as one of a read target and a write target, and the address of BANK 19. The host 2 issues a command for determining the status of BANK 19 ("status command"). That is, the host 2 according to the present embodiment also recognizes each of the plurality of BANK units and further determines the status of the BANK unit (for example, a: the BANK unit is holding write data or preparing to hold the write data, b: the BANK unit is holding read data or preparing to hold the read data, or c: the BANK unit is performing neither of the operations). Upon using this function to determine that all the BANK units are in operation, the host 2 avoids issuing a read or write instruction. In contrast, upon determining that at least one BANK units is empty (is not in operation), the host 2 gives a write instruction or a read instruction to the semiconductor chip 1.

2. Conceptual Diagram of Data Transfer

A conceptual diagram of data transfer according to the second embodiment will be described with reference to FIG. 10. Here, the host 2 sets BANK 19 such that BANK 19 is divided into two BANK units (in FIG. 10, BANK<0> and BANK<1>). Each of the BANK units corresponds to 2 Kbytes.

As shown in FIG. 10, BANK 19 can hold write data supplied by the host 2 via NAND I/F 17. Furthermore, BANK 19 temporarily holds data read from the memory cell array 10 and then outputs the data to the host 2 via NAND I/F 17. BANK 19 performs data I/O operations via BANK accesses (in FIG. 10, BANK Access) to and from NAND I/F 17. BANK 19 also performs data I/O operations via memory accesses (in FIG. 10, Memory Access) to and from the memory cell array 10.

The bank access between BANK 19 and NAND I/F 17 is carried out simultaneously with the memory access between BANK 19 and the memory cell array 10. Specifically, by way of example, with NAND I/F 17 performing a write operation on BANK<0>, the memory cell array 10 performs a read operation on BANK<1>, as shown in FIG. 10. Specific examples of commands transferred from the host 2 will be described below with reference to FIG. 11.

3. Details of Commands

Figure 11:
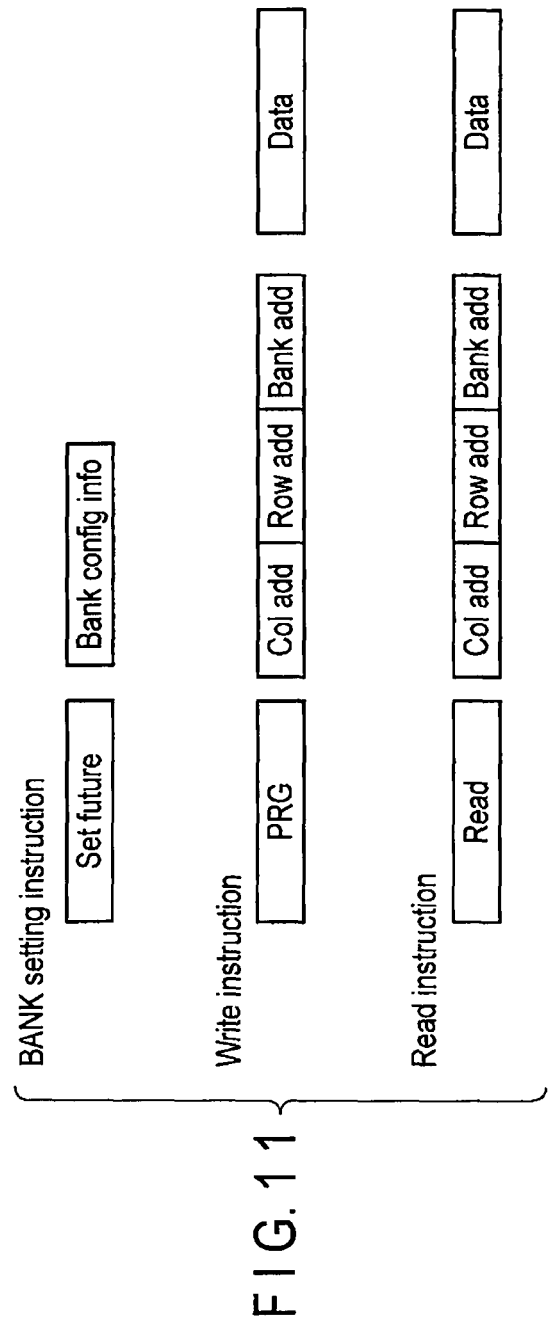
FIG. 11 is a conceptual diagram illustrating the details of commands according to the second embodiment.

FIG. 11 shows the details of commands issued to the semiconductor chip 1 by the host 2. Specifically, FIG. 11 shows a BANK setting instruction, a write instruction, and a read instruction.

The BANK setting instruction includes a "set Fututer" command and a "Bank config Infor" command. Issuance of the bank setting instruction allows the above-described setting to be made for BANK 19. That is, as described above, the BANK setting command sets the number of units into which BANK 19 is divided. In view of the difference in data transfer rate between the bank access and the memory access, the number of BANK units is set depending on how data is to be transferred, that is, the number is set, for example, to allow data read to be carried out during a write operation.

The write instruction includes a "Write command", "Col Add", "Row Add", "Bank Add", and net "Data". That is, the write instruction according to the present embodiment includes, in addition to the address of the memory cell serving as a write target and write data, address information about BANK 19 that temporarily holds data to be written to the memory cell MC.

The read instruction includes a "Read" command, "Col Add", "Row Add", and "Bank Add". That is, the read instruction according to the present embodiment includes, in addition to the address of the memory cell serving as a read target, address information about BANK 19 that temporarily holds data read from the memory cell MC. The read command allows the data read from the memory cell MC to be temporarily held in the specified BANK 19 and then read out to NAND I/F 17.

3. Data Transfer Operation (1)

Figure 12:
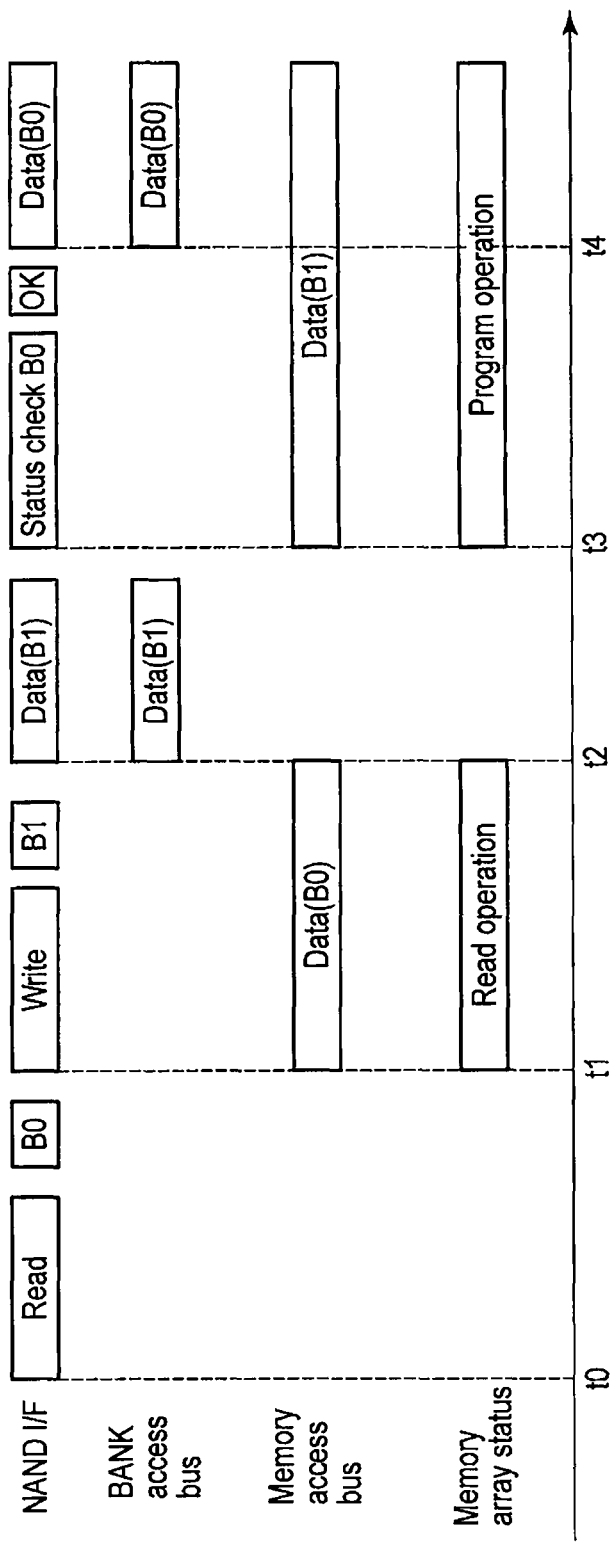
FIG. 12 is a time chart illustrating data transfer according to the second embodiment.

A data transfer operation using the above-described BANK will be described with reference to FIG. 12. FIG. 12 is a time chart showing how a data transfer illustrated in FIG. 10 is carried out. Specifically, FIG. 12 is a time chart showing that BANK<0> holds read data from the memory cell array 10, while write data is transferred from the host 2 via NAND I/F 17, temporarily held in BANK<1>, and then transferred to the memory cell array 10. As shown in FIG. 12, the axis of ordinate indicates an output from NAND I/F 17, a data transfer between NAND I/F 17 and BANK<1> (in FIG. 12, expressed as BANK Access Bus), a data transfer between the memory cell array 10 and BANK<0> (in FIG. 12, expressed as Memory Access Bus), and the status of the memory cell array 10 (in FIG. 12, expressed as Memory Array Status). The axis of abscissas indicates time. The chart assumes that the setting command has been issued to BANK 19 and that BANK 19 has been divided into two BANK units BANK<0> and BANK<1>.

As shown in FIG. 12, at time t0, a command indicative of a read instruction is issued by the host 2 via NAND I/F 17. That is, as described in FIG. 11, after the "Read" command, a "Col Add" address, a "Row Add" address, and a "Bank Add" address are issued (in FIG. 12, "B0" is Bank Add indicative of BANK<0>). Then, at the subsequent time t1, a read operation is performed on the memory cell array 10 to transfer read data from the memory cell array 10 to BANK<0> via a data line (Memory Access Bus).

At time t1, when read data starts to accumulate in BANK<0>, a command indicative of a write instruction (in FIG. 12, denoted as "Write") is issued by the host 2 via NAND I/F 17. That is, as described with reference to FIG. 11, after the "Write" command, a "Col Add" address, a "Row Add" address, and the above-described "Bank Add" address are issued (in FIG. 12, "B1" is Bank Add indicative of BANK<1>). Then, at time t2, write data is transferred from NAND I/F 17 to BANK<1>.

Then, at time t3, the controller 14 carries out a status check on the read data held in BANK<0>. If the result of the check indicates that read from the memory cell array 10 to BANK<0> has ended, then subsequently at time t4, the controller 14 transfers the read data from BANK<0> to NAND I/F 17.

Furthermore, while carrying out a status check on BANK<0> as described above, the controller 14 transfers the write data from BANK<1> to the memory cell array 10 at time t3. Thus, at time t3, the memory cell array 10 starts an operation of writing the write data transferred from BANK<1>.

4. Data Transfer Operation (2)

Figure 13:
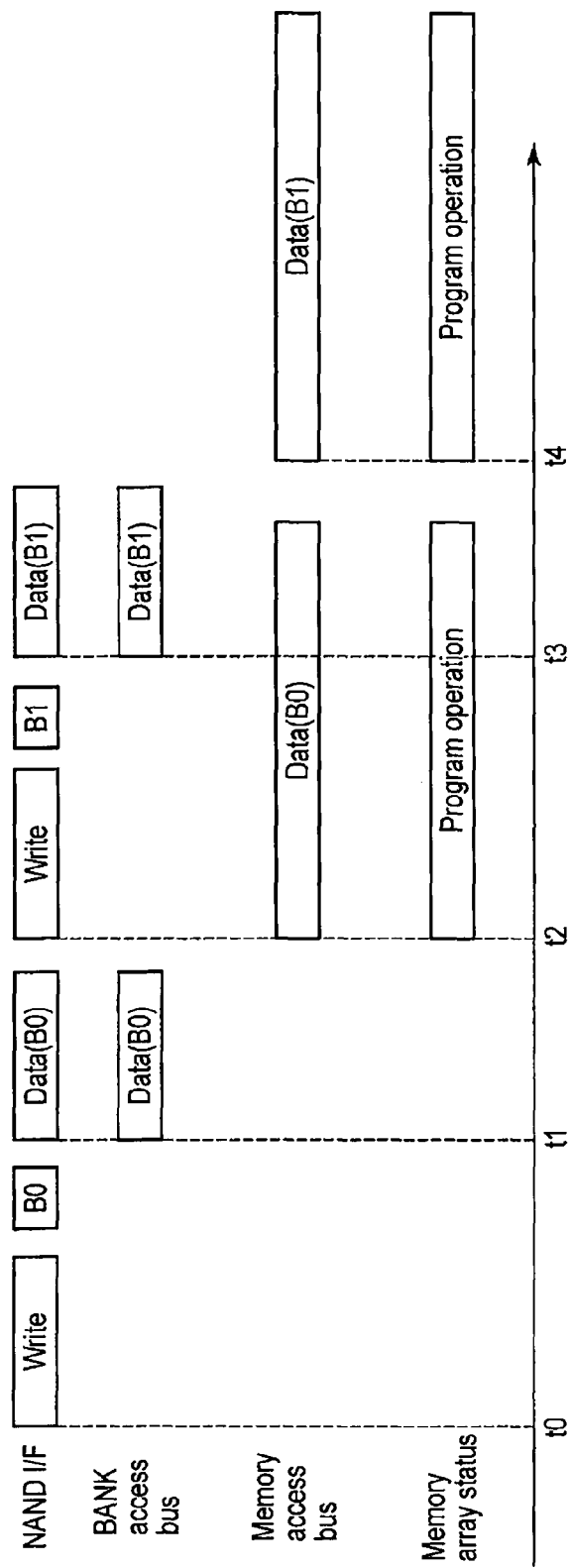
FIG. 13 is a time chart illustrating data transfer according to the second embodiment.

A data transfer operation will be described with reference to FIG. 13. FIG. 13 is a time chart showing that write data is written to the memory cell array 10 using both BANK<0> and BANK<1>.

At time t0, the host 2 issues a write operation via NAND I/F 17. That is, as described above with reference to FIG. 11, after the "Write" command, "Col Add", "Row Add", and "Bank Add" (in FIG. 12, denoted as "B0") are issued by the host 2. After the issuance of the command and the addresses, at time t1, write data is transferred to BANK<0> via NAND I/F 17.

Then, at time t2, the host 2 issues a further write instruction via NAND I/F 17. That is, after the "Write" command, "Col Add", "Row Add", and "Bank Add" (in FIG. 12, denoted as "B1") are issued. While the command is being issued, the first write data is transferred from BANK<0>, in which write data is accumulated, to the memory cell array 10. That is, a write operation is performed on the memory cell array 10 at time t2.

While the first data from BANK<0> is being written to the memory cell array 10, the write data is transferred from NAND I/F 17 to BANK<1> at the subsequent time t3.

Thereafter, immediately before time t4, the data write from BANK<0> to the memory cell array 10 ends. Thus, at time t4, the write data is written from BANK<1> to the memory cell array 10.

5. Data Transfer Operation (3)

Figure 14:
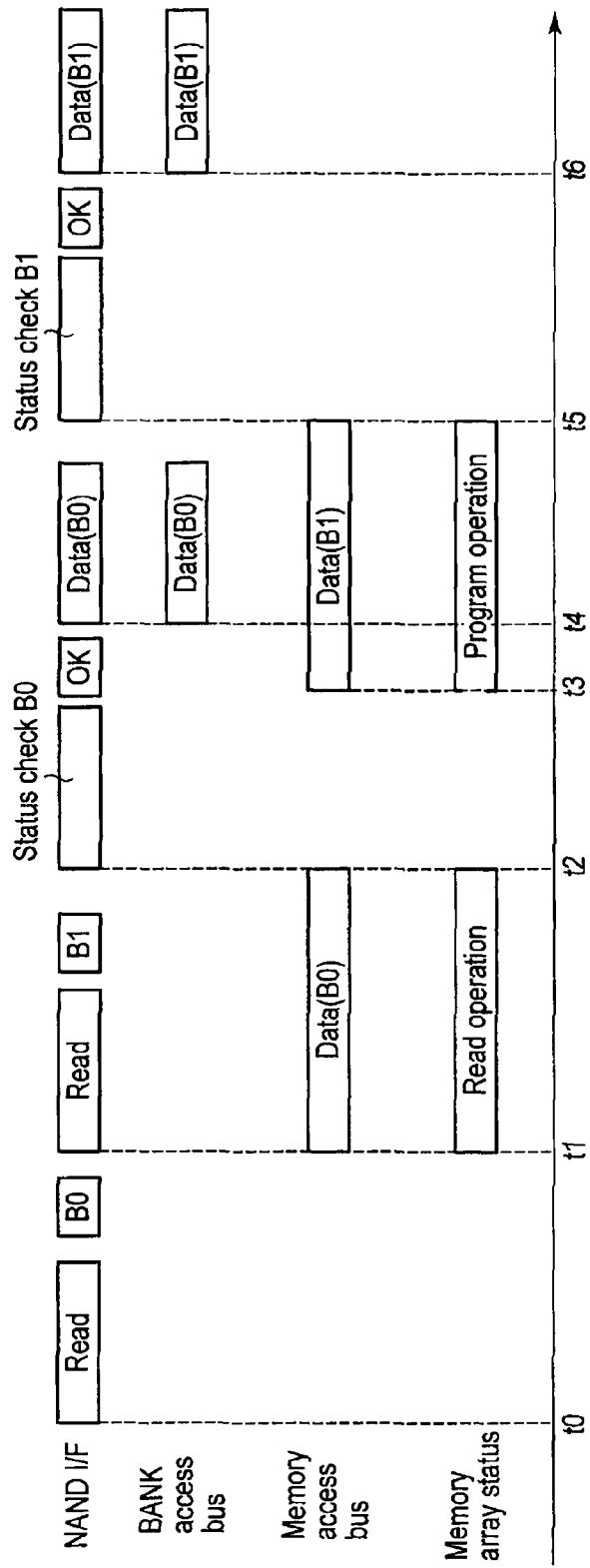
FIG. 14 is a time chart illustrating data transfer according to the second embodiment.

A further data transfer operation will be described with reference to FIG. 15. FIG. 14 is a time chart illustrating an operation of reading data from the memory cell array 10 using both BANK<0> and BANK<1>.

At time t0, NAND I/F 17 issues a read instruction is issued by the host 2 via NAND I/F 17. That is, a "Read" command is issued and then "Col Add", "Row Add", and "Bank Add" (in FIG. 12, denoted as "B0") are issued. Then, at time t1, data read from the memory cell array 10 to BANK<0> starts to accumulate. At time t1, when the read data starts to accumulate in BANK<0>, the host 2 issues a further read instruction via NAND I/F 17.

Then, at time t2, the controller 14 carries out a status check on BANK<0>. That is, the controller 14 checks to see if any write error has occurred. Thereafter, at time t3, read data from the memory cell array 10 starts to accumulate in BANK<1>. Furthermore, if, at time t3, the status check on BANK<0> indicates that no write error has occurred, then at time t4, the read data is transferred from BANK<0> to the host 2 via NAND I/F 17.

Moreover, at time t5, a status check is carried out on BANK<1>. If no write error has occurred, then at time t6, the read data held in BANK<1> is transferred to the host 2 via NAND I/F 17.

The memory system according to the second embodiment can exert an effect described below in (2).

(2) High-speed data transfer can be achieved. The memory system according to the second embodiment includes the plurality of BANK units each of which can hold write or read data and an associated address (an address in the memory cell array 10 as described above). The host 2 according to the present embodiment can, for example, recognize each of the divided BANK units by issuing "Bank Add" as described above. Thus, each of the BANK units can be instructed to perform various operations so that while write data is being accumulated in one of the BANK units, read data from the memory cell array 10 can be accumulated in the remaining BANK units.

For comparison's sake, a data transfer using a page register instead BANK will be described by way of example. As is well known, the page register is formed of a plurality of data latches and can hold one of write data and read data at a certain time. In a data transfer using the page register, the semiconductor chip 1 performs one of a read operation and a write operation via the busy signal described in the first embodiment and avoids simultaneous execution of a write operation and a read operation. Thus, the page register holds one of write data and read data. Specifically, 1) upon receiving a read instruction from the host 2, the semiconductor chip 1 performs a read operation and outputs read data resulting from the read operation to the host 2. This ends the read operation. If a write operation is to be performed, 2) the write operation needs to be performed, for example, before or after the read operation in 1). Thus, the page register cannot simultaneously perform two or more operations, and when one operation ends, shifts to the next operation. Hence, the data transfer requires time. Therefore, only one of the two types of data, that is, the read data and the write data, can be simultaneously held. Furthermore, even if the page register is divided into two portions, the host used for the page resister cannot recognize each of the resultant portions of the page register. As a result, only one of the two portions can be used, precluding data to be transferred at a sufficient rate.

In contrast, the memory system according to the present embodiment can recognize each of the plurality of BANK units resulting from the division and thus simultaneously instruct the plurality of BANK units to carry out the same data transfer or different data transfers. Specifically, such operations as illustrated in FIG. 12 to FIG. 14 can be performed. Thus an efficient data transfer can be achieved.

Furthermore, as described above, the memory access has a higher data transfer rate than the bank access. Thus, even if, for example, a data transfer from the memory cell array 10 to BANK<1>, based on the memory access, ends earlier than a data transfer from NAND I/F 17 to BANK<0>, since write data has already started to accumulate in BANK<0>, the present embodiment enables data transfer to be more efficiently achieved than the use of the page register.

Since BANK<0> and BANK<1> are each 2 Kbytes in size, the present embodiment allows the data write to BANK<0> and BANK<1> to be finished earlier than the configuration in which the BANK<0> and BANK<1> are each 4 Kbytes in size. That is, a write to the memory cell array 10 can be started after 2 Kbytes of data have been written to BANK<0> or BANK<1>, and thus the present embodiment can finish the write earlier than the configuration in which 4 Kbytes of data are written to the bank.

[Third Embodiment]

Now, a memory system according to a third embodiment will be described. In the description of the present embodiment, instead of two BANKs, four BANKs (BANK<0>, BANK<1>, BANK<2>, and BANK<3>) are provided by way of example. The configuration of the present embodiment is the same as that of the above-described second embodiment except for the increased number of BANKs, and will thus not be described below. Each of the BANKs is, for example, 1 Kbytes in size. However, the present embodiment is not limited to this size.

1. Conceptual Diagram of Data Transfer

A conceptual diagram of a data transfer using BANK<0> to BANK<3> will be described with reference to FIG. 15. Each of BANK<0> to BANK<3> carries out data transfer via bank accesses to and from NAND I/F 17 and memory accesses to and from the memory cell array 10. That is, each of BANK<0> to BANK<3> accepts write data from NAND I/F 17 or outputs read data to NAND I/F 17, while transferring write data to the memory cell array 10 or accepting read data from the memory cell array 10. In an exemplary operation of this configuration, for example, BANK<0> may be involved in bank accesses, whereas the remaining BANKs, each of BANK<1> to BANK<3>, may be involved in memory accesses. The data transfer using BANKs is not limited to this operation. Furthermore, in this case, BANK<0> to BANK<3> are provided by way of example, but the number of BANKs is not limited to four. Any other number of BANKs may be provided. This is because the memory access generally has a higher data transfer rate than the bank access as described above. The higher data transfer rate of the memory access is also due to the configuration in which, instead of a NAND flash memory with MOS transistors connected together in series, Re-RAM is used as the memory cells MC.

The data transfer rate of each of the memory access and the bank access may vary depending on the size of data held in BANK 19, the size of the memory access bus, and the characteristics of the memory cell MC. That is, the number of BANKs and the like are set according to the data transfer rate determined based on the plurality of parameters described above.

Thus, the number of BANKS involved in bank accesses to and from NAND I/F and the number of BANKs involved in memory accesses to and from the memory cell array 10 may be varied depending on the data transfer rates of the memory access and the bank access determined based on the plurality of parameters described above. Specifically, by way of example, BANK<0> to BANK<3> may be provided, and BANK<0> may be involved in bank accesses, whereas the remaining BNKs, BANK<1> to BANK<3>, may be involved in memory accesses. Moreover, if the memory access has a higher data transfer rate than the bank access but the difference in data transfer rate between the memory access and the bank access is small, BANK<0> and BANK<1> may be involved in bank accesses, whereas the remaining BNKs, BANK<2> and BANK<3>, may be involved in memory accesses. Alternatively, the number of BANKs may further be increased (for example, BANK<0> to BANK<4>) so that BANK<0> and BANK<1> are involved in bank accesses, whereas the remaining BNKs, BANK<2> to BANK<4>, are involved in memory accesses. As described above, the number of BANKs or the number of divisions are set by a "Set Config Info" command from the host 2.

2. Data Transfer Operation

Figure 16:
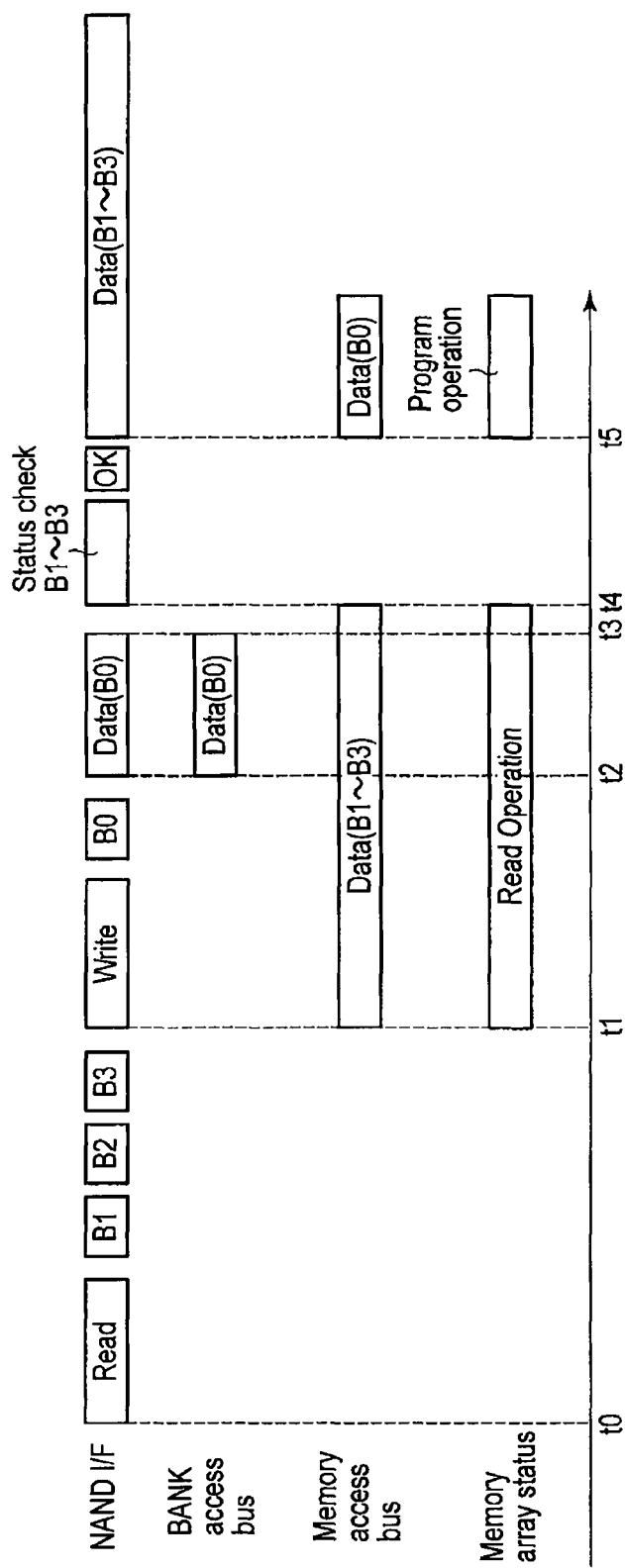
FIG. 16 is a time chart illustrating data transfer according to the third embodiment.

Now, an example of a data transfer operation will be described with reference to FIG. 16. FIG. 16 is a time chart illustrating an operation of transferring write data to BANK<0>, while transferring data read from the memory cell array 10 to BANK<1> to BANK<3>.

At time t0, the host 2 provides a read instruction via NAND I/F 17. That is, at time t0, the host 2 issues, in addition to the above-described "Read" command, "Band Add" indicative of BANK<1> to BANK<3>. Then, at time t1, read data starts to be transferred from the memory cell array 10 to BANK<1> to BANK<3>. Furthermore, at time t1, when the read data starts to be held in BANK<0>, the host 2 provides a write instruction via NAND I/F 17. That is, the host 2 issues, in addition to the above-described "Write" command, "Band Add" indicative of BANK<0> and write data (in FIG. 16, denoted as Data). That is, the write data supplied by the host 2 is transferred to BANK<0>, and the write to BANK<0> ends at time t3. The data from the memory cell array 10 is transferred to BANK<0> to BANK<3>, for example, in the order in which the corresponding "Bank Add" addresses are issued by the host 2. However, the present embodiment is not limited to this order.

Then, at time t4, the controller 14 carries out a status check on BANK<1> to BANK<3>. If the results of the status check indicate no problem, then at time t5, the read data held in BANK<0> to BANK<3> is transferred to the host 2 via NAND I/F 17. Furthermore, at the same time when the read operation is performed, that is, at time t5, the write data held in BANK<0> is written to the memory cell array 10. That is, at time t5, a write operation is performed on the memory cell array 10.

The memory system according to the present embodiment can exert an effect described below in addition to the effect (2) produced by the above-described second embodiment. That is, the present embodiment includes more BANKs than the above-described second embodiment. Thus, if the process involves a large amount of write data or instead a large amount of read data, an efficient data transfer can be achieved by varying the number of BANKs used for write or read. Specifically, as an example, the data transfer described with reference to FIG. 14 can be achieved. In the case illustrated in FIG. 14, the amount of read data is larger than that of write data by way of example. Thus, an efficient data transfer can be achieved by not only simultaneously performing a read operation and a write operation but also varying the number of BANKs corresponding to the write operation or read operation, depending on the difference in the amount of data involved in the operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array comprising a plurality of memory cells capable of holding data; and
   a data latch group capable of holding a first address of the memory cell serving as a read target or a second address of the memory cell serving as a write target, and the data held by the memory cells,
   wherein the data latch group comprises a plurality of data latch units including at least a first data latch unit and a second data latch unit,
   the first data latch unit holds first write data to be written to any of the memory cells and a first write address corresponding to the first write data, or first read data read from the memory cell array and a first read address corresponding to the first read data, while the second data latch unit holds second write data to be written to any of the memory cells and a second write address corresponding to the second write data, or second read data read from the memory cell array and a second read address corresponding to the second read data.

2. The device according to claim 1, further comprising:
   a data I/O section receiving and outputting one of write data as the first and second write data and read data as the first and second read data,
   wherein a number of the data latch units is set according to a difference between a rate of data transfer between the data I/O section and the data latch group and a rate of data transfer between the data latch group and the memory cell array.

3. The device according to claim 2, further comprising:
   a controller,
   wherein the controller receives a third address indicative of the first data latch unit and a fourth address indicative of the second data latch unit, from the data latch group, and
   the first data latch unit and the second data latch unit are allowed to hold the write data or read data in accordance with the third and fourth addresses.

4. The device according to claim 3, wherein the memory cell array includes:
   a first signal line formed along a first direction;
   a second signal line formed along a second direction orthogonal to the first direction; and
   the memory cells each provided near a first area where the first signal line and the second signal line cross each other, the memory cells being electrically connected together by the first signal lie and the second signal line,
   each of the memory cells having one of a first status and a second status which are capable of being electrically determined.

5. The device according to claim 1, further comprising:
   a data I/O section configured to receive and output read data as the first and second read data and write data as the first and second write data;
   a first data line configured to connect the data I/O section and the data latch group together; and a second data line configured to connect the data latch group and the memory cell array together, wherein data transfer on the second data line is faster than data transfer on the first data line.

6. The device according to claim 5, wherein the number of the data latch units is set according to a difference in data transfer rate between the first data line and the second data line on which the data is transmitted.

7. The device according to claim 6, wherein, for the data write, the data I/O section outputs the write data, the first write address and/or second write address of the memory cell serving as the write target, and a third address indicative of the first data latch unit and/or a fourth address indicative of the second data latch unit, for the data read, the data I/O section outputs the first read address and/or second read address of the memory cell serving as the read target, and the third address and/or the fourth address.

8. A controller outputting data capable of being held by memory cells, a first address of each of the memory cells capable of holding the data, and a second address indicative of each of a plurality of data latch units provided in a data latch group capable of holding the data and the first address, wherein before an operation of writing the data and an operation of reading the data, a number of the data latch units provided in the data latch group is set according to a first rate of data transfer between the memory cell and the data latch group and a second rate of data transfer between the data latch group and a data I/O section.

9. The controller according to claim 8, wherein a write command or a read command is issued which corresponds to the number of data latch units provided in the data latch group.

10. The controller according to claim 8, wherein a command for determining usage of the data latch group is issued to the data latch group, and the write command and/or the read command is issued according to the usage, wherein the usage is a status indicating whether the data latch group is loading the write data from the data I/O section or writing the loaded write data to the memory cell, or the data latch group is loading read data from the memory cell or transferring the loaded read data to the data I/O section, or the data latch group holds neither of the write data and the read data.

11. A memory system comprising:

a semiconductor chip; and a controller configured to control the semiconductor chip, wherein the semiconductor chip includes:

a memory cell array comprising a plurality of memory cells capable of holding data;

a data latch group capable of holding write data to be written to the memory cell and a first address of the memory cell serving as a read target, and read data read from the memory cell and a first read address of the memory cell serving as a read target, wherein the data latch group comprises a plurality of data latch units including at least a first data latch unit and a second data latch unit, wherein the semiconductor chip further includes a data I/O section receiving and outputting the data from and to the controller, wherein before an operation of writing the data and an operation of reading the data, the controller sets a number of the data latch units provided in the data latch group according to a first rate of data transfer between the memory cell and the data latch group and a second rate of data transfer between the data latch group and the data I/O section.

12. The system according to claim 11, wherein, for a write of the data, the controller issues a write command including the write data, the first write address, and a third address indicative of the first data latch unit to the semiconductor chip, and for a read of the data, the controller issues a read command including a second read address and a fourth address indicative of the second data latch unit to the semiconductor chip.

13. The system according to claim 12, wherein the memory cell array includes:

a first signal line formed along a first direction;

a second signal line formed along a second direction orthogonal to the first direction; and the first memory cells each provided near a first area where the first signal line and the second signal line cross each other, the memory cells being electrically connected together by the first signal lie and the second signal line, wherein each of the memory cells has one of a first status and a second status which are capable of being electrically determined.

14. The system according to claim 13, further comprising:

a data I/O section receiving and outputting the read data and the write data;

a first data line connecting the data I/O section and the data latch group together; and a second data line connecting the data latch group and the memory cell array together, wherein data transfer on the second data line is faster than data transfer on the first data line.

15. The system according to claim 13, wherein the number of the data latch units is set by the controller according to a difference in data transfer rate between the first data line and the second data line on which the data is transmitted.

16. The system according to claim 11, wherein a write command and a read command transferred from the controller allow the first data latch unit to hold the write data to be written to the memory cell and the first address, while allowing the second data latch unit to hold read data read from the memory cell array or the second address of the memory cell serving as a read target.

17. The system according to claim 11, wherein a write command transferred from the controller allows each of the first data latch unit and the second data latch unit in the semiconductor chip to hold the data to be written to the memory cell and the first address.

18. The system according to claim 11, wherein a read command transferred from the controller allows each of the first data latch unit and the second data latch unit in the semiconductor chip to hold the data read from the memory cell and the second address of the memory cell serving as a read target.

* * * * *